(12) United States Patent
Kershteyn

(10) Patent No.: US 7,423,455 B2
(45) Date of Patent: Sep. 9, 2008

(54) SYSTEMS AND METHODS FOR A 5:1 MULTIPLEXER WITH A ONE-FIFTH RATIO DUTY CYCLE CLOCK

(75) Inventor: Boris Kershteyn, Marietta, GA (US)

(73) Assignee: Ciena Corporation, Linthicum, MD (US)

( * ) Notice: Subject to any disclaimer, the term of this patent is extended or adjusted under 35 U.S.C. 154(b) by 30 days.

(21) Appl. No.: 11/652,289

(22) Filed: Jan. 11, 2007

(65) Prior Publication Data
US 2008/0170587 A1   Jul. 17, 2008

(51) Int. Cl.
*H03K 19/00* (2006.01)
(52) U.S. Cl. .............................. 326/93; 326/38; 327/407
(58) Field of Classification Search .................... 326/38, 326/93; 327/407
See application file for complete search history.

(56) References Cited

U.S. PATENT DOCUMENTS 7,325,024 B2 * 1/2008 Mathew et al. .............. 708/706

OTHER PUBLICATIONS

Charles C. Lin; "Case Study: Implementing a 5-1 MUX"; 2003, All rights reserved.

* cited by examiner

*Primary Examiner*—Daniel D Chang
(74) *Attorney, Agent, or Firm*—Clements Bernard Miller; Christopher L. Bernard; Tyler S. Brown

(57) ABSTRACT

The present invention provides methods and systems for multiplexing five channels, such as 10 Gb/s to 50 Gb/s, into a single data sequence using a 5:1 multiplexer using a $\frac{1}{5}^{th}$ ratio duty cycle clock. The $\frac{1}{5}^{th}$ ratio duty cycle clock is a clock with a period equal to the channel data rate, and a pulse width equal to the period of data rate five times higher. The $\frac{1}{5}^{th}$ ratio duty clock is combined with a proper combination of delays and phase shifters to allow the use of AND gates and OR gates to combine the five channels in a proper sequence to create a serial five-times higher data sequence.

13 Claims, 4 Drawing Sheets

SYSTEMS AND METHODS FOR A 5:1 MULTIPLEXER WITH A ONE-FIFTH RATIO DUTY CYCLE CLOCK

FIELD OF THE INVENTION

The present invention relates generally to high-speed signal multiplexers, and more particularly to a 5:1 multiplexer with a $1/5^{th}$ ratio duty cycle clock.

BACKGROUND OF THE INVENTION

High-speed data rates common in networking environments, such as 100 gigabits-per-second (Gb/s), require multiplexers to create a serial stream from several lower-rate signals. At a 50 GHz operating frequency, for example, 2:1 and 4:1 multiplexers are known in the art. Such devices are configured with two or four inputs and a single, multiplexed output. Currently, 5:1 multiplexers are not available for high-speed applications, such as 50 GHz.

100 Gigabit Ethernet (100 GbE) is an Ethernet standard presently under early development by the Institute of Electrical and Electronics Engineers (IEEE). In late November of 2006, an IEEE study group agreed to target 100 GbE as the next version of the technology. Additionally, high-speed optical systems are moving beyond the existing 10 Gb/s line rates to higher time-division-multiplexed (TDM) rates, such as 40 Gb/s and 100 Gb/s. Advantageously, 100 Gb/s optical signals offer an effective way to achieve 1 Tb/s utilizing 10 wavelengths of 100 Gb/s signals over wavelength division multiplexing.

Disadvantageously, the lack of 5:1 multiplexers will require multiple cascaded multiplexers with several clocks to achieve a native 100 GbE or 100 Gb/s signal. Alternatively, 100 GbE could be transmitted in parallel, such as five 20 Gb/s signals. However, this solution is inefficient with respect to the transmission rate, requiring five transmitters and receivers per signal. A 100 Gb/s signal for optical transmission would not be transmitted in parallel because this would remove any advantage of having a higher TDM rate.

A 5:1 multiplexer could be formed using 4:1 and 2:1 multiplexers; however such an implementation requires three bit clock control which requires gating of three clocks. Disadvantageously, this gating is a very challenging approach. Additionally, existing 4:1 multiplexers at high data rates (e.g., 50 Gb/s and the like) utilize clock division internally, and therefore cannot be used in combination with a 2:1 multiplexer to create a 5:1 multiplexer.

No known native 5:1 multiplexers exist for high data rates, such as 50 Gb/s or 100 Gb/s. Thus, there exists a need for a 5:1 multiplexer operable at high data rates with a single reference clock.

BRIEF SUMMARY OF THE INVENTION

In various exemplary embodiments of the present invention, five channels, such as 10 Gb/s to 50 Gb/s, are multiplexed to one with a 5:1 multiplexer using a $1/5^{th}$ ratio duty cycle clock. The $1/5^{th}$ ratio duty cycle clock is a clock with a period equal to the channel data rate, and a pulse width equal to the period of a data rate five times higher. The $1/5^{th}$ ratio duty cycle clock is combined with a proper combination of delays and phase shifters to allow the use of AND and OR gates to combine the five channels in a proper sequence to create a serial five-times higher data sequence.

Advantageously, the present invention can implement a 5:1 multiplexer at high data rates with existing AND and OR gates. Also, the present invention allows multiplexing of data sequences to form, for example, a 100 Gb/s data sequence using two of the 5:1 multiplexers. This is used to form 100 Gigabit Ethernet or the like in a single data sequence, allowing optimized transmission as a single signal versus requiring multiple signals, such as 20 Gb/s. Further, the present invention utilizes a single reference clock to form the 5:1 multiplexed signal. The present invention can be integrated into a single application specific integrated circuit (ASIC).

In an exemplary embodiment of the present invention, a 5:1 multiplexer with a $1/5^{th}$ ratio duty cycle clock includes a reference clock; a clock module configured to create a $1/5^{th}$ ratio duty cycle clock from the reference clock; five phase shifters configured to phase shift the $1/5^{th}$ ratio duty cycle clock by successive time periods to create five clocks, wherein each of the five clocks corresponds to time periods in a multiplexed output stream; five AND gates, wherein the inputs to the five AND gates each include one of five data streams and one of the five clocks; and a plurality of OR gates configured to combine the outputs from the five AND gates into a single data sequence. Optionally, the 5:1 multiplexer includes a D Flip Flop which is input with the single data sequence and clocked with a clock equal to five times the reference clock. The output of the D Flip Flop includes a non-return-to-zero (NRZ) data stream including the five data streams in a single multiplexed output. Alternatively, the 5:1 multiplexer includes an AND gate which is input with the single data sequence and a phase-shifted clock equal to five times the reference clock. The output of the AND gate includes a return-to-zero (RZ) data stream including the five data streams in a single multiplexed output. The clock module include a first clock source (F1) and a second clock source (F1*5), and wherein the first and second clock source are synchronized to the reference clock. The $1/5^{th}$ ratio duty cycle clock is created by inputting the first clock source and a phase-shifted compliment of the first clock source into an AND gate. The inputs to the 5:1 multiplexer include signals at bit rates between 10 gigabits-per-second and 50 gigabits-per-second. Optionally, the 5:1 multiplexer is contained within an application specific integrated circuit.

In another exemplary embodiment of the present invention, a method of performing 5:1 multiplexing with a $1/5^{th}$ ratio duty cycle clock includes receiving a reference clock; creating a $1/5^{th}$ ratio duty cycle clock from the reference clock; phase shifting the $1/5^{th}$ ratio duty cycle clock to create five clocks, wherein each of the five clocks corresponds to a successive time periods; and combining five data streams with the five clocks to create a multiplexed output. Optionally, the method further includes inputting the multiplexed output into a D Flip Flop with a clock signal equal to five times the reference clock, wherein the output of the D Flip Flop includes a non-return-to-zero multiplexed data stream. Alternatively, the method further includes inputting the multiplexed output into an AND gate with a clock signal equal to five times the reference clock, wherein the output of the AND gate includes a return-to-zero multiplexed data stream. Optionally, the method is performed by an application specific integrated circuit.

In yet another exemplary embodiment of the present invention, a multiplexing system includes a reference clock; ten data streams; two 5:1 multiplexers each input with the reference clock and five of the ten data streams; and a 2:1 multiplexer input with the output of each of the 5:1 multiplexers, and the reference clock. The 5:1 multiplexer includes a clock module configured to create a $1/5^{th}$ ratio duty cycle clock from the reference clock; five phase shifters configured to phase shift the $1/5^{th}$ ratio duty cycle clock by successive time periods to create five clocks, wherein each of the five clocks corresponds to time periods in a multiplexed output stream; five AND gates, wherein the inputs to the five AND gates include one of five data streams and one of the five clocks; and a plurality of OR gates configured to combine the outputs from the five AND gates into a single data sequence. In one application, the multiplexing system is utilized to form 100 gigabit Ethernet. In another application, the multiplexing system is utilized to form a 1 terabit-per-second signal.

BRIEF DESCRIPTION OF THE DRAWINGS

The present invention is illustrated and described herein with reference to the various drawings, in which like reference numbers denote like method steps and/or system components, respectively, and in which.

DETAILED DESCRIPTION OF THE INVENTION

In various embodiments of the present invention, five channels, such as 10 Gb/s to 50 Gb/s, are multiplexed to one with a 5:1 multiplexer using a $\frac{1}{5}^{th}$ ratio duty cycle clock. The $\frac{1}{5}^{th}$ ratio duty cycle clock is a clock with a period equal to the channel data rate, and a pulse width equal to the period of data rate five times higher. The $\frac{1}{5}^{th}$ ratio duty cycle clock is combined with a proper combination of delays and phase shifters to allow the use of AND and OR gates to combine the five channels in a proper sequence to create a serial five-times higher data sequence.

Advantageously, the present invention can implement a 5:1 multiplexer at high data rates with existing AND and OR gates. Also, the present invention will allow multiplexing of data sequences to form, for example, a 100 Gb/s data sequence using two of the 5:1 multiplexers. This could be used to form 100 Gigabit Ethernet or the like in a single data sequence, allowing optimized transmission as a single signal versus requiring multiple signals, such as 20 Gb/s. Further, the present invention utilizes a single reference clock to form the 5:1 multiplexed signal. The present invention can be integrated into a single application specific integrated circuit (ASIC).

Figure 1:
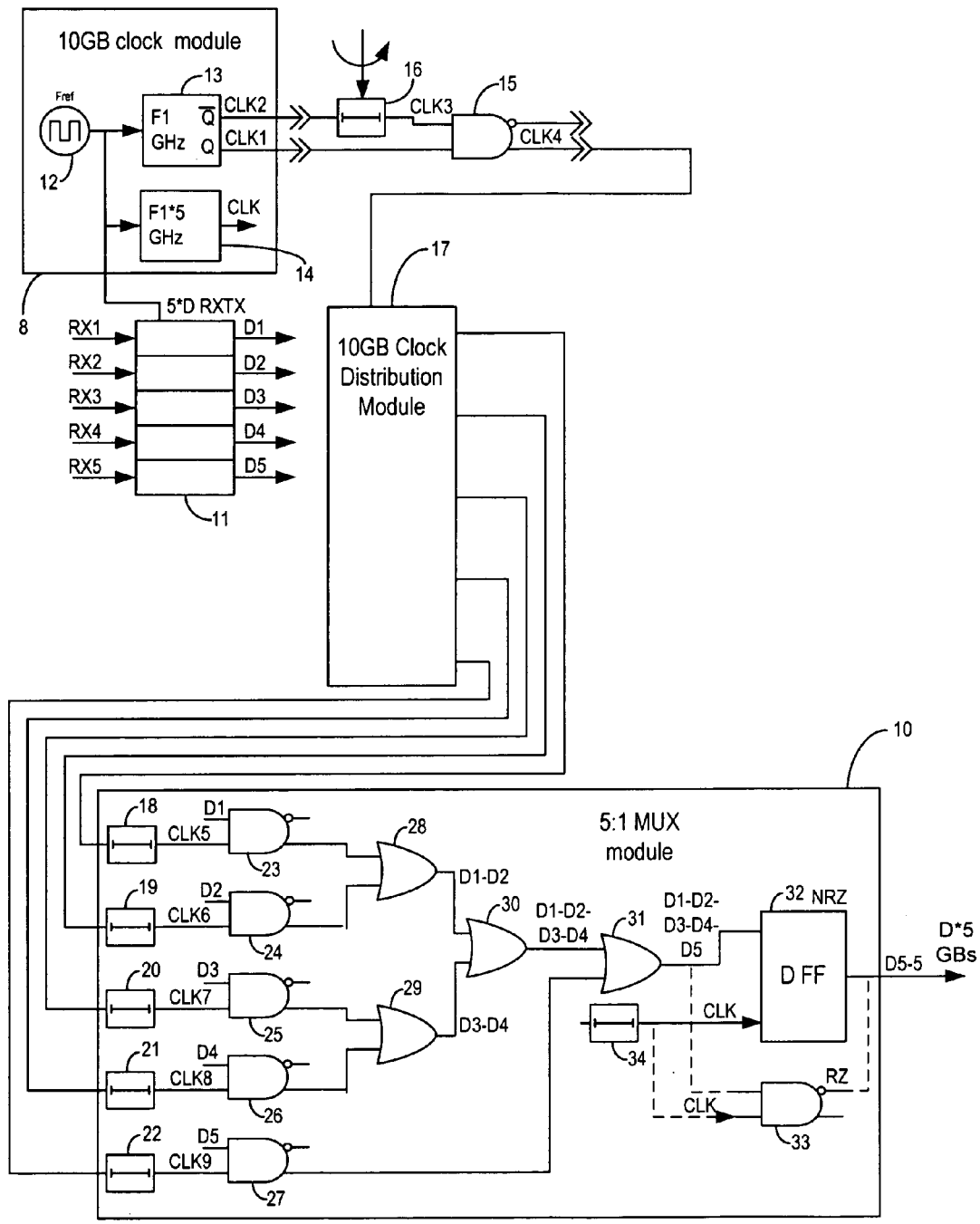
FIG. 1 is a block diagram of one exemplary embodiment of a 5:1 multiplexer with a $\frac{1}{5}^{th}$ ratio duty cycle clock connected to a five-channel parallel data stream and a clock module.

Referring to FIG. 1, an exemplary embodiment of a 5:1 multiplexer 10 with a $\frac{1}{5}^{th}$ ratio duty cycle clock is illustrated connected to a five-channel parallel data stream (5*D RXTX) 11 and a clock module 8. The data from the five-channel parallel data stream 11 is synchronized by the same reference clock ($F_{ref}$) 12 as two clock sources, F1 13 and F1*5 14. The five-channel parallel data stream 11 can include signals of any type, such as signals with bit rates between 10 Gb/s and 50 Gb/s. A main clock, CLK1, which is the output of F1 13 is input to an AND gate 15, and a second input to the AND gate 15 is a complimentary clock output (CLK2) through a phase shifter 16 (CLK3) set to delay $\frac{1}{5}^{th}$ of the main clock F1 13 output. The output of the AND gate 15 is a $\frac{1}{5}^{th}$ ratio duty cycle clock (CLK4), and the pulse width in CLK4 is equal to one bit of data (D5-5), five times higher than the original ones (D).

The CLK4 is provided to a clock distribution module 17 which is configured to distribute CLK4 to the 5:1 multiplexer 10. Alternatively, the multiplexer 10 can be configured to receive CLK4 and perform the functionality of clock distribution module 17 internally to the multiplexer 10. CLK4 is input into five delay/phase shifters 18, 19, 20, 21, and 22 to create five clocks CLK5, CLK6, CLK7, CLK8, and CLK9, which correspond to successive time periods for the multiplexed data, D1 through D5. The five clocks CLK5, CLK6, CLK7, CLK8, and CLK9 are each delayed by one bit of output data D5-5 relative to the previous one with the delay/phase shifters 18, 19, 20, 21, and 22 configured to provide the appropriate delay.

The five clocks CLK5, CLK6, CLK7, CLK8, and CLK9 are each input into AND gates 23, 24, 25, 26, and 27 respectively. The data D1, D2, D3, D4, and D5 are also input into AND gates 23, 24, 25, 26, and 27 respectively with the clocks. After the AND gates 23, 24, 25, 26, and 27, the data D1, D2, D3, D4, and D5 is in the appropriate time slot for multiplexing by five. The remaining devices perform a combination function utilizing OR gates 28, 29, 30, and 31.

The outputs of AND gates 23 and 24 are combined in OR gate 28 to provide a signal which combines D1 and D2. The outputs of AND gates 25 and 26 are combined in OR gate 29 to provide a signal which combines D3 and D4. The outputs of OR gates 28 and 29 are combined in OR gate 30 to provide a signal which combines D1, D2, D3, and D4. Finally, the output of OR gate 30 and AND gate 27 are combined in OR gate 31 to provide a signal which combines D1, D2, D3, D4, and D5. The present combination of AND gates 23, 24, 25, 26, and 27 and OR gates 28, 29, 30, and 31 can be arranged in different combinations as would be readily apparent to those of ordinary skill in the art.

In one exemplary embodiment, the output of OR gate 31 is input into D flip flop 32 which is clocked with CLK. CLK is the output of clock F1*5 14, which is five times higher than CLK1. CLK is input to the D flip flop 32 through a phase shifter 34. The output, D5-5, of the D flip flop 32 is a signal including D1, D2, D3, D4, and D5 multiplexed five to one. The D flip flop 32 performs retiming to form a non-return to zero (NRZ) output D5-5. In another embodiment, the output of OR gate 31 is input into an AND gate 33 along with CLK through a phase shifter as another input. Advantageously, this embodiment performs retiming to form a return-to-zero (RZ) output D5-5.

As will be readily apparent to those of ordinary skill in the art, the various components can include AND gates, OR gates, phase shifters, flip flops, clock oscillators, and the like. The present invention can be integrated into an application specific integrated circuit (ASIC), field programmable gate array (FPGA), or the like. It is envisioned that the present invention will operate at high frequencies, such as 50 GHz and the like.

Figure 2:
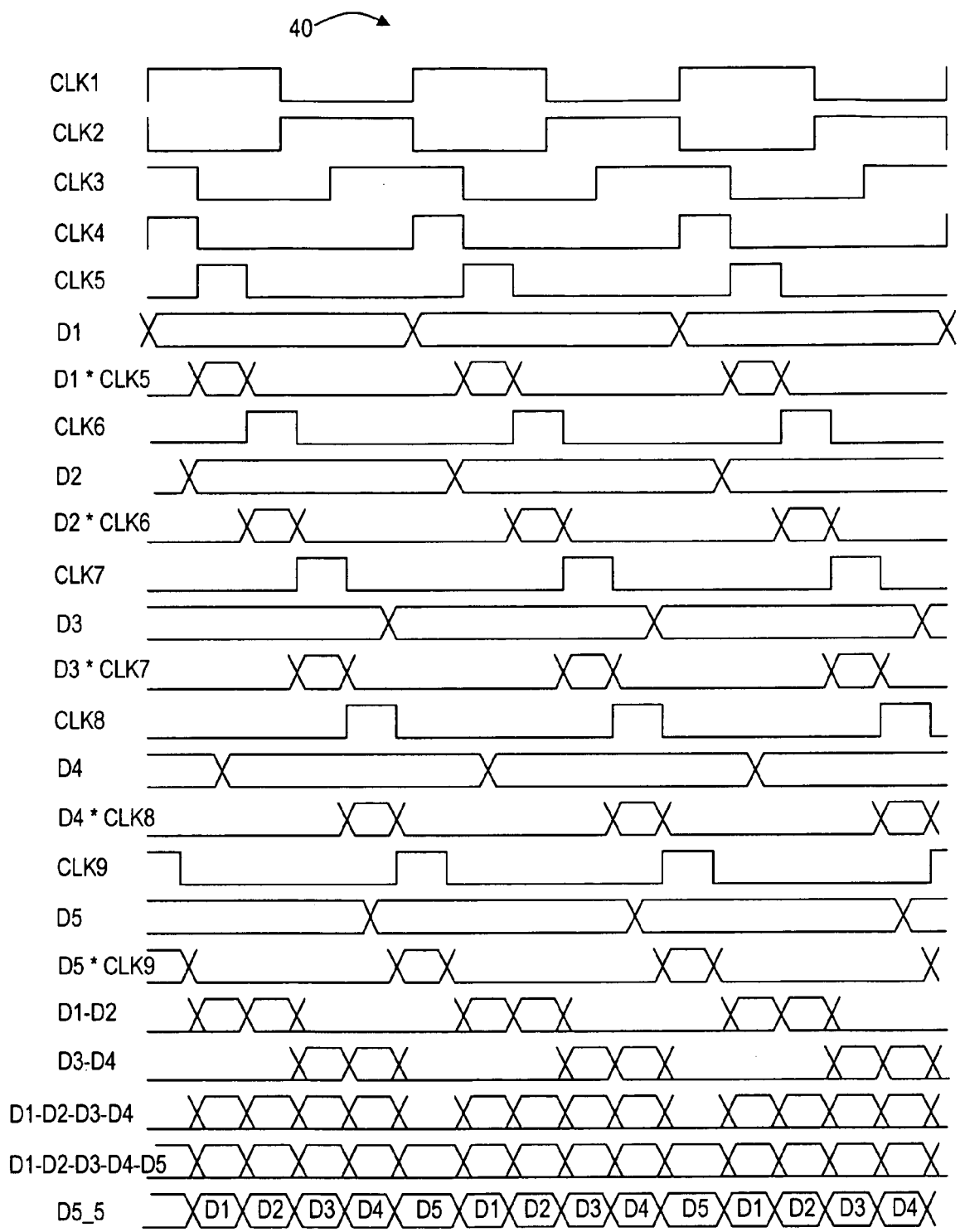
FIG. 2 is a timing diagram illustrating the clock signals and the five data signals throughout various stages of the 5:1 multiplexing in one exemplary embodiment.

Referring to FIG. 2, a timing diagram 40 illustrates the relationship between the clocks, data channels, and phase shifted clocks in an exemplary embodiment of the 5:1 multiplexer of the present invention. CLK1 is the output of the F1 clock 13, and for example, could be at a 10.7 GHz rate. CLK2 is the complimentary output of the F1 clock 13, and for example, could also be at a 10.7 GHz rate. CLK3 is phase shifted by the phase shifter 13. The phase shift in CLK3 is such when CLK3 is input into AND gate 15 with CLK1, that CLK4 is created which has a period equal to $\frac{1}{5}^{th}$ of CLK1's rate.

CLK5 is created by phase shifting CLK4 with phase shifter 18. CLK5 and the first data stream, D1, are input into AND gate 23 to form D1*CLK5 which represents D1, but in the appropriate time slot for the 5:1 multiplexing. Accordingly, CLK6, CLK7, CLK8, and CLK9 are created by phase shifting CLK4 with phase shifters 19, 20, 21, and 22. Then these clocks, CLK6, CLK7, CLK8, and CLK9, and the respective data streams D2, D3, D4, and D5 are input into AND gates 24, 25, 26, and 27, respectively, to form D2*CLK6, D3*CLK7, D4*CLK8, and D5*CLK9, which represent D2, D3, D4, and D5, but in the appropriate time slots for the 5:1 multiplexing.

D1*CLK5 and D2*CLK6 are input into OR gate 28 to form D1-D2, which represents a combination of data streams D1 and D2. D3*CLK7 and D4*CLK8 are input into OR gate 29 to form D3-D4, which represents a combination of data streams D3 and D4. D1-D2 and D3-D4 are input into OR gate 30 to form D1-D2-D3-D4. Finally, D1-D2-D3-D4 is input with D5*CLK9 into OR gate 31 to form D1-D2-D3-D4-D5, which represents all five data streams in a single sequence. Finally, the output D5_5 is retimed up with either D Flip Flop 32 (i.e., for an NRZ signal) or AND gate 33 (i.e., for an RZ signal).

Figure 3:
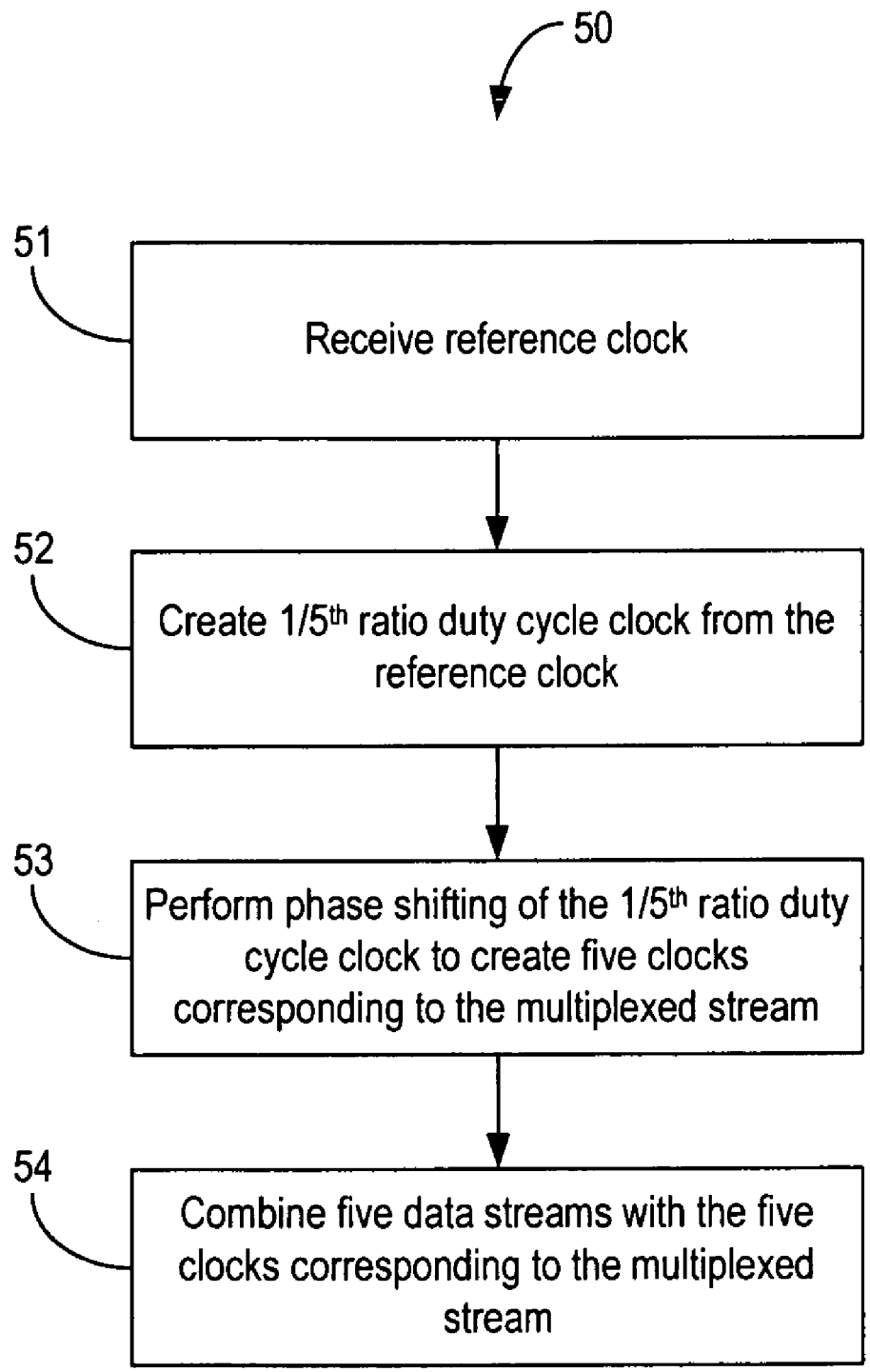
FIG. 3 is a flowchart illustrating a 5:1 multiplexing method with a $\frac{1}{5}^{th}$ ratio duty cycle clock.

Referring to FIG. 3, an exemplary method 50 of the present invention to perform 5:1 multiplexing of five data streams utilizing a single $\frac{1}{5}^{th}$ ratio duty cycle clock is illustrated. A reference clock is received, as depicted in step 51. Advantageously, the multiplexing method 50 requires only a single reference clock, such as, for example, a 10 GHz, a 10.7 GHz, or the like. A $\frac{1}{5}^{th}$ ratio duty cycle clock is created from the reference clock, as depicted in step 52. The $\frac{1}{5}^{th}$ ratio duty cycle clock is a clock with a period equal to the channel data rate, and a pulse width equal to a period five times higher than the data rate. The rise and fall time of the $\frac{1}{5}^{th}$ ratio duty cycle clock is specified as in 50% duty cycle clock for the data rate five times higher.

Phase shifting is performed on the $\frac{1}{5}^{th}$ ratio duty cycle clock to create five clocks corresponding each to respective slots in the multiplexed stream, as depicted in step 53. This step is done by feeding the same $\frac{1}{5}^{th}$ ratio duty cycle clock into delays, phase shifters, or the like, each with the proper adjustment. The five data streams are combined with the five corresponding clocks to form the multiplexed signal, as depicted in step 54. This step can be done with a combination of AND gates, OR gates, and the like.

Figure 4:
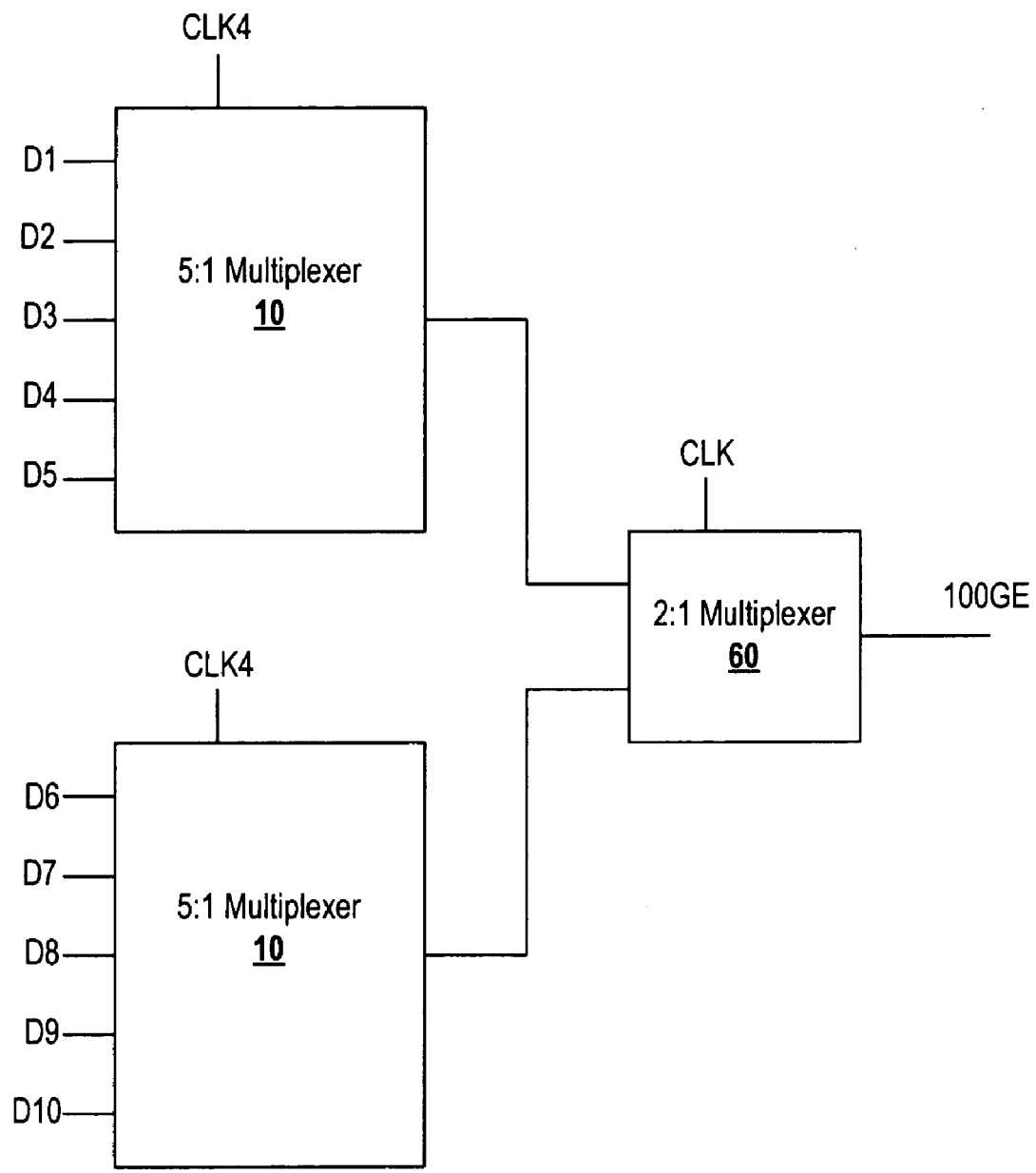
FIG. 4 is an exemplary application of the 5:1 multiplexer of the present invention utilized to form a 100 GE signal.

Referring to FIG. 4, an exemplary application of the present invention includes using the 5:1 multiplexers 10 to create a single signal, such as a 100 gigabit Ethernet (100 GE) stream. Advantageously, the present invention provides a 5:1 multiplexer 10 that utilizes a single reference clock to combine five separate data streams. In FIG. 4, two 5:1 multiplexers 10 are configured to receive ten data streams D1 through D10, respectively. Each of the 5:1 multiplexers 10 is configured to receive a common reference clock CLK4, similar to the CLK4 depicted in FIG. 1. The output of each of the 5:1 multiplexers 10 is input into a single 2:1 multiplexer 60 along with another clock reference CLK. Here, the CLK reference (F1*5) can still be used using both positive and negative amplitude for clocking, effectively providing an F1*10 clock. The output of the 2:1 multiplexer 60 provides a single data stream, such as a 100 GE signal.

Similarly, the 5:1 multiplexers 10 of the present invention could be utilized to combine data sequences to form other signal types, such as a 100 Gb/s signal or a 1 Tb/s signal for optical transmission. Advantageously, the present invention overcomes existing limitations where current multiplexers are defined only for multiples of 2, such as 2:1, 4:1, etc.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A 5:1 multiplexer with a $\frac{1}{5}^{th}$ ratio duty cycle clock, comprising:
   a reference clock;
   a clock module configured to create a $\frac{1}{5}^{th}$ ratio duty cycle clock from the reference clock;
   five phase shifters configured to phase shift the $\frac{1}{5}^{th}$ ratio duty cycle clock by successive time periods to create five clocks, wherein each of the five clocks corresponds to time periods in a multiplexed output stream;
   five AND gates, wherein the inputs to the five AND gates each comprise one of five data streams and one of the five clocks; and
   a plurality of OR gates configured to combine the outputs from the five AND gates into a single data sequence.

2. The 5:1 multiplexer of claim 1, further comprising a D Flip Flop input with the single data sequence and clocked with a clock equal to five times the reference clock.

3. The 5:1 multiplexer of claim 2, wherein the output of the D Flip Flop comprises a non-return-to-zero (NRZ) data stream comprising the five data streams in a single multiplexed output.

4. The 5:1 multiplexer of claim 1, further comprising an AND gate input with the single data sequence and a phase-shifted clock equal to five times the reference clock.

5. The 5:1 multiplexer of claim 4, wherein the output of the AND gate comprises a return-to-zero (RZ) data stream comprising the five data streams in a single multiplexed output.

6. The 5:1 multiplexer of claim 1, wherein the clock module comprises a first clock source (F1) and a second clock source (F1*5), and wherein the first and second clock source are synchronized to the reference clock.

7. The 5:1 multiplexer of claim 6, wherein the $\frac{1}{5}^{th}$ ratio duty cycle clock is created by inputting the first clock source and a phase-shifted compliment of the first clock source into an AND gate.

8. The 5:1 multiplexer of claim 1, wherein the inputs comprise signals at bit rates between 10 gigabits-per-second and 50 gigabits-per-second.

9. The 5:1 multiplexer of claim 1, wherein the 5:1 multiplexer is contained within an application specific integrated circuit.

10. A method of performing 5:1 multiplexing with a $\frac{1}{5}^{th}$ ratio duty cycle clock comprising the steps of:
    receiving a reference clock;
    creating a $\frac{1}{5}^{th}$ ratio duty cycle clock from the reference clock;
    phase shifting the $\frac{1}{5}^{th}$ ratio duty cycle clock to create five clocks, wherein each of the five clocks corresponds to a successive time periods; and
    combining five data streams with the five clocks to create a multiplexed output.

11. The method of claim 10, further comprising the step of inputting the multiplexed output into a D Flip Flop with a clock signal equal to five times the reference clock, wherein the output of the D Flip Flop comprises a non-return-to-zero multiplexed data stream.

12. The method of claim 10, further comprising the step of inputting the multiplexed output into an AND gate with a clock signal equal to five times the reference clock, wherein the output of the AND gate comprises a return-to-zero multiplexed data stream.

13. The method of claim 10, wherein the method is performed by an application specific integrated circuit.

* * * * *